US008743613B2

(12) United States Patent
Wang et al.

(10) Patent No.: US 8,743,613 B2
(45) Date of Patent: Jun. 3, 2014

(54) TIMING CONTROL IN SYNCHRONOUS MEMORY DATA TRANSFER

(75) Inventors: Kailai Wang, Shanghai (CN); Liang Zhao, Shanghai (CN)

(73) Assignee: Freescale Semiconductor, Inc., Austin, TX (US)

( * ) Notice: Subject to any disclaimer, the term of this patent is extended or adjusted under 35 U.S.C. 154(b) by 150 days.

(21) Appl. No.: 13/607,810

(22) Filed: Sep. 10, 2012

(65) Prior Publication Data

US 2013/0258777 A1    Oct. 3, 2013

(30) Foreign Application Priority Data

Mar. 28, 2012 (CN) .......................... 2012 1 0142693

(51) Int. Cl.
G11C 16/06 (2006.01)
G11C 7/10 (2006.01)

(52) U.S. Cl.
CPC .............. *G11C 16/06* (2013.01); *G11C 7/1078* (2013.01)
USPC .................. 365/185.11; 365/189.16; 365/194

(58) Field of Classification Search
CPC .... G11C 7/22; G11C 7/1078; G11C 11/4076; G11C 16/04; G11C 16/10
USPC .................. 365/185.11, 189.16, 189.17, 194, 365/233.1, 233.12, 233.16, 189.02
See application file for complete search history.

(56) References Cited

U.S. PATENT DOCUMENTS

| 4,090,239 | A | 5/1978 | Twibell |
| 4,499,536 | A | 2/1985 | Gemma |
| 5,522,064 | A | 5/1996 | Alderegula |
| 6,327,196 | B1 * | 12/2001 | Mullarkey ..................... 365/194 |
| 6,842,395 | B2 * | 1/2005 | Kawai et al. ............. 365/189.14 |
| 7,023,746 | B2 | 4/2006 | Mizuhashi |
| 7,301,831 | B2 | 11/2007 | Ware |
| 7,911,250 | B2 | 3/2011 | Okubo |

* cited by examiner

*Primary Examiner* — Tan T. Nguyen
(74) *Attorney, Agent, or Firm* — Charles Bergere

(57) ABSTRACT

A solid-state memory device has a memory interface that includes a timing signal port for receiving a timing signal, a data transfer port, a data transfer module for transferring blocks of data signals between the data transfer port and the memory module, and a selectable delay module for providing a selected delay between transitions in the data signals DQ and transitions in the timing signals DQS. The memory interface also has a delay controller for setting the selected delay, for detecting a variation in a delay produced by the selectable delay module relative to a reference delay, for controlling a pause in transfer of a block of the data signals DQ, and for adjusting the selected delay during the pause.

18 Claims, 4 Drawing Sheets

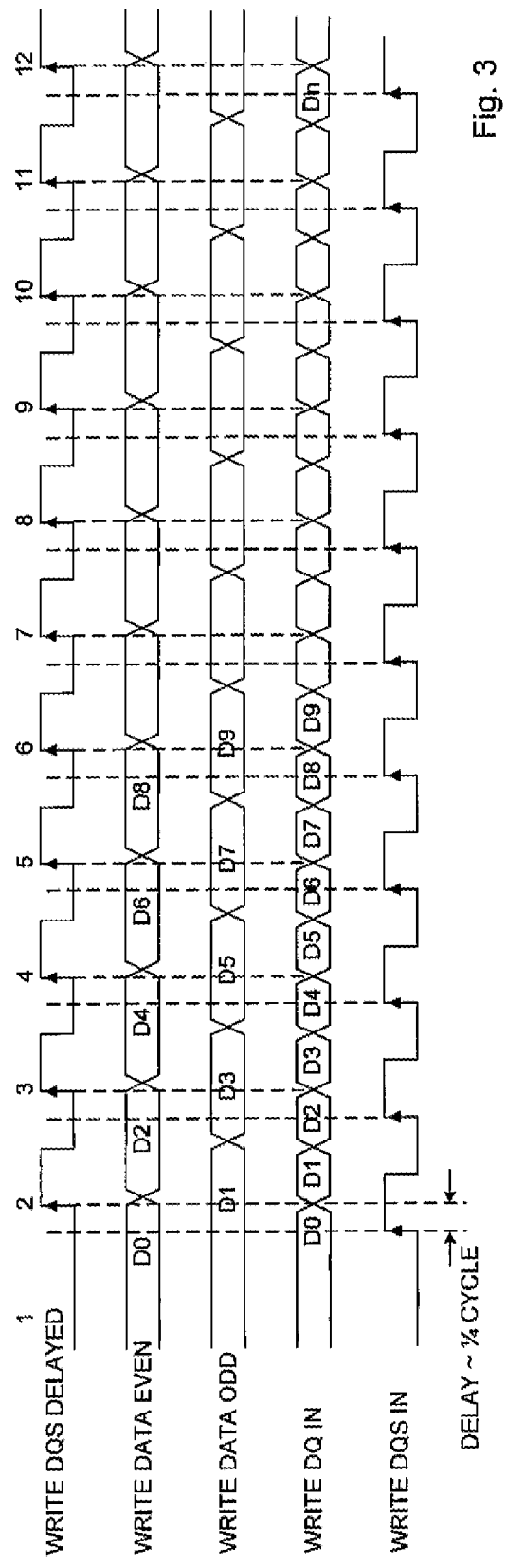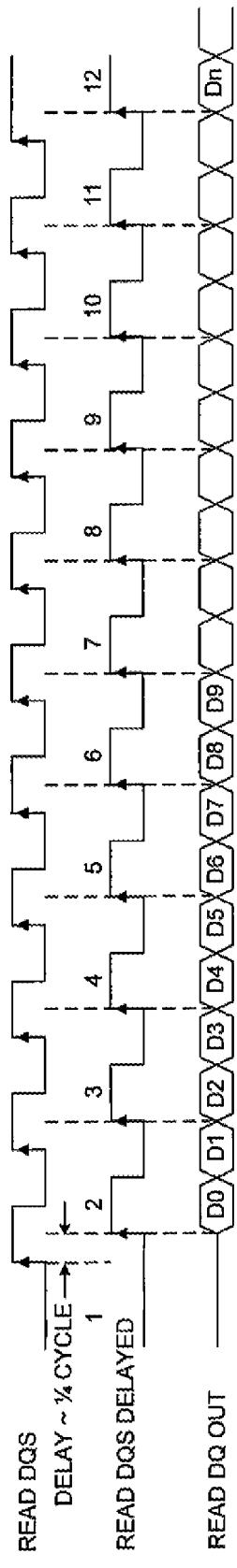
Fig. 3
Fig. 4

TIMING CONTROL IN SYNCHRONOUS MEMORY DATA TRANSFER

BACKGROUND OF THE INVENTION

The present invention is directed to solid state memory devices, and more particularly to timing control in synchronous memory data transfer.

Solid-state memory exists in various forms, in which data is stored in the form of digital signals, typically semiconductor devices. Flash memory is a non-volatile solid-state memory that can be electronically erased and reprogrammed. Flash memory exists in NAND and NOR types. Dynamic random access memory (DRAM) and static random access memory (SRAM) are volatile memory in which data can be written and read. In these and other forms of memory, transfers of data between the memory and a data transfer port, that is to say programming or writing data into and reading data from the memory, may be performed synchronously. In synchronous data transfer, a timing signal usually referred to as a clock or strobe signal is provided by the system to which the memory is coupled. The system includes an interface between the memory and the data transfer port that controls the timing of the data transfers relative to the timing signal.

Data transfer in blocks increases the speed of the transfers and enables block erase operations in NAND flash memory, for example. The timing of the data transfers may be critical, especially at high bandwidth (data transfer speeds). The window for the transitions in the data signals is small at high bandwidth, and transitions falling outside the window can lead to missed data transfers and corruption of the transferred data. Thus, it would be advantageous if the memory interface included a programmable delay module that provides a defined delay between transitions in the read or write data signals and transitions in the clock or strobe signals.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

FIG. 3 is a timing diagram of signals appearing in operation of the solid-state memory device in the write configuration of FIG. 1;

FIG. 4 is a timing diagram of signals appearing in operation of the solid-state memory device in the read configuration of FIG. 2.

DETAILED DESCRIPTION OF THE INVENTION

Figure 1:
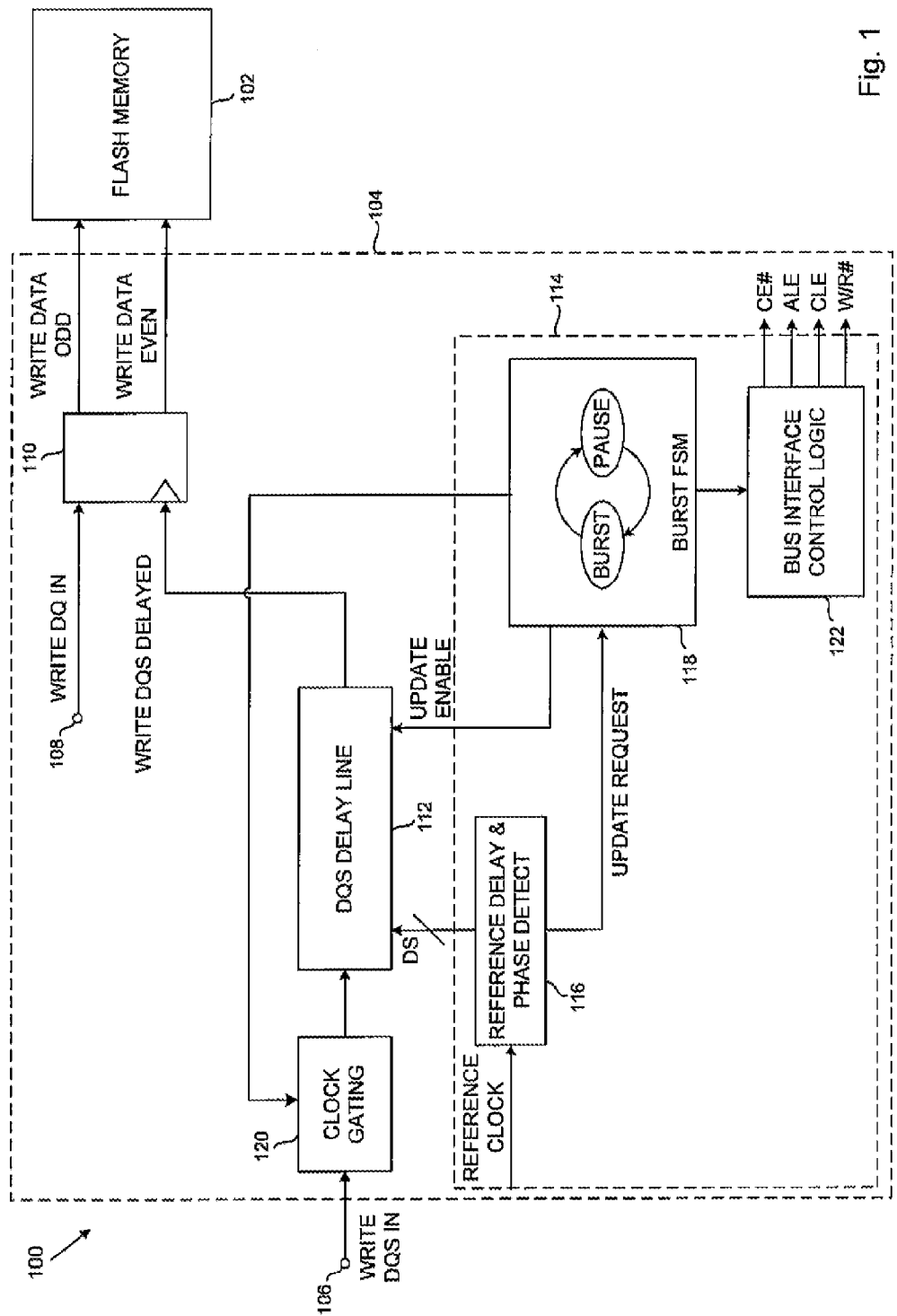
FIG. 1 is a schematic block diagram of a solid-state memory device in accordance with one embodiment of the invention given by way of example, in write configuration.
Figure 2:
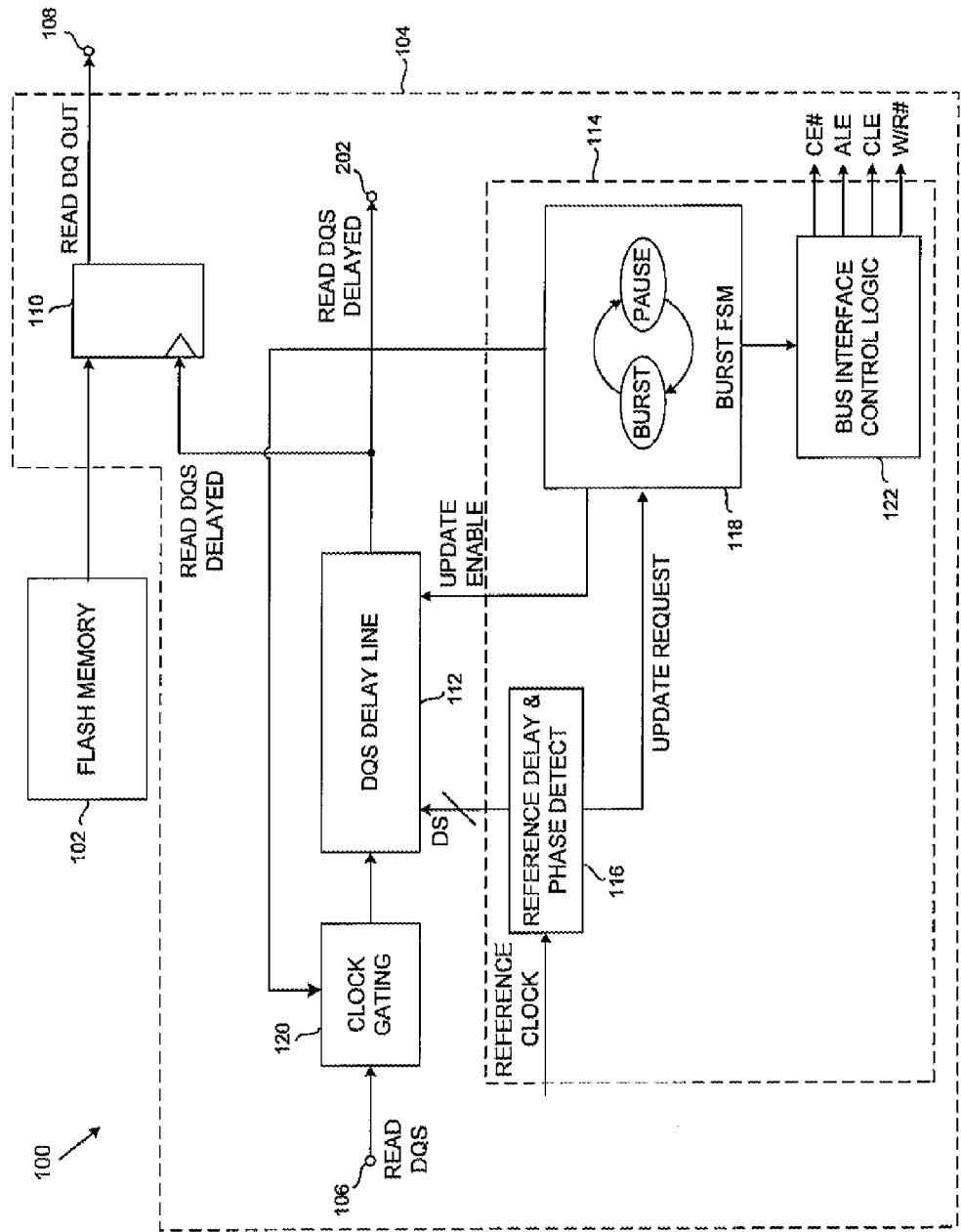
FIG. 2 is a schematic block diagram of the solid-state memory device of FIG. 1 in read configuration.

FIGS. 1 and 2 illustrate a solid-state memory device 100 in accordance with an example of an embodiment of the invention having a memory module 102 and a memory interface 104. The memory interface 104 includes a timing signal port 106 for receiving a timing signal DQS, a data transfer port 108, a data transfer module 110 for transferring blocks of data signals DQ between the data transfer port 108 and the memory module 102, and a selectable delay module 112 for providing a selected delay between transitions in the data signals DQ and transitions in the timing signals DQS. The memory interface 104 also includes a delay controller 114 for setting the selected delay, for detecting a variation in a delay produced by the selectable delay module 112 relative to a reference delay, for controlling a pause in transfer of a block of the data signals DQ, and for adjusting the selected delay during the pause.

In one embodiment of the invention, the memory module 102 is a flash memory module. In other embodiments of the invention, the memory module 102 is based on other technologies using block transfer of data signals between the data transfer port 108 and the memory module 102.

The selectable delay module 112 may provide a selected delay in the data signals DQ when the data transfer module 110 is transferring blocks of data signals DQ to the memory module 102 for write operations; the selected delay in the data signals DQ may be provided by a selected delay in the timing signal DQS with which write operations of the data signals DQ are synchronized. The selectable delay module 112 may provide a selected delay in the timing signal DQS when the data transfer module 110 is transferring blocks of data signals DQ from the memory module 102 to the data transfer port 108 for read operations. The data transfer module 110 may be a synchronous double data rate ('DDR') transfer module.

The delay controller 114 may include a reference delay element and phase detector 116 for detecting the variation in a delay. Controlling a pause in transfer of a block of the data signals may include the delay controller 114 pausing application of the timing signals DQS to the data transfer module 110.

In more detail, FIG. 1 illustrates the solid-state memory device 100 in a DDR write configuration, and FIG. 2 illustrates the solid-state memory device 100 in a DDR read configuration, in accordance with the Open NAND Flash Interface (ONFi) specification. In use, the solid-state memory device 100 is connected with a host (not shown) that drives a data bus (not shown) to provide data for write operations and that receives data from the solid-state memory device 100 driving the data bus during read operations. In accordance with the ONFi specification, for either the NV-DDR or NV-DDR2 data interface, a strobe signal for the DQ data bus, called DQS (DQ strobe), is used as the timing signal for data. The data timing signal DQS is bi-directional and is used for all data transfers. The data timing signal DQS is not used for command or address cycles. The latching edge of DQS is center aligned to the valid data window for data transfers from the host to the device (writes). The latching edge of DQS is aligned to the transition of the DQ bus for data transfers from the device to the host (reads). The data signals DQ and the timing signals DQS are provided by the host during write operations and are provided by the solid-state memory device 100 during read operations.

The reference delay element and phase detector 116 sets the delay in the timing signal DQS provided by the selectable delay module 112 by setting a delay selection signal DS. The delay controller 114 includes a burst finite state machine 118 that controls a clock gating element 120 enabling transitions in the timing signals DQS at the timing signal port 106 to pass to the selectable delay module 112 and to control timing of read or write operations during bursts of data transfer. The delay controller 114 blocks transitions of the timing signals DQS through the clock gating element 120 during a pause in the transfer of a block of data, as provided by the ONFi specification revision 3.0 section 4.17.2.4 for NV-DDR data transfer and section 4.17.3.3 for NV-DDR2 data transfer.

The burst finite state machine 118 also controls a bus interface control logic module 122, which controls data transfer operations of the solid-state memory device 100. The bus interface control logic module 122 provides a chip enable signal CE#, an address latch enable signal ALE, a command latch enable signal CLE, and a write/read direction signal W/R# in accordance with the ONFi specification. During transfer of a block of data the address latch enable signal ALE and command latch enable signal CLE are asserted. During a pause in the transfer of a block of data, the address latch enable signal ALE and command latch enable signal CLE are set to zero to set the data bus state to idle. If the reference delay element and phase detector 116 detects a variation in the delay that the selectable delay module 112 provides, it adjusts the delay selection signal DS during a pause in the transfer of a block of data to correct the delay in the timing signal DQS.

FIG. 3 illustrates the relative timing of data signals WRITE DQ IN and timing signals WRITE DQS IN for write data transfer operations. As shown, windows D0 to Dn for valid data latching are defined around rising and falling latching edges of the timing signal DQS. During write data transfer operations, the timing signal WRITE DQS IN is provided by the host and received by the solid-state memory device 100 at the timing signal port 106. A block of the data signals WRITE DQ IN is provided by the host and received by the solid-state memory device 100 at the data transfer port 108. During bursts of data transfer, the timing signal WRITE DQS IN is passed by the clock gating element 120 to the selectable delay module 112 which delays the timing signal by an amount set by the reference delay element and phase detector 116 and provides a delayed timing signal WRITE DQS DELAYED to synchronize the data transfer module 110 latching the data signal voltage that the host has applied to the data bus. In this example of a DDR solid-state memory device 100, the data transfer module 110 has two outputs which provide to the flash memory 102 respectively even-numbered and odd-numbered data INTERNAL DATA EVEN and INTERNAL DATA ODD.

FIG. 4 illustrates the relative timing of data signals READ DQ OUT and timing signals READ DQS and READ DQS DELAYED for read data transfer operations. During read data transfer operations, the timing signal READ DQS is generated by the memory interface 104 relative to reference clock and command clock signals and applied at the timing signal input 106. As shown, during bursts of data transfer, the timing signal READ DQS is passed by the clock gating element 120 to the selectable delay module 112 which delays the timing signal READ DQS by an amount set by the reference delay element and phase detector 116 and provides a delayed timing signal READ DQS DELAYED to the data transfer module 110 and at a timing signal output port 202. Windows D0 to Dn for valid data latching and sampling are defined by rising and falling latching edges of the timing signal READ DQS DELAYED. A block of data signals READ DQ OUT is provided by the solid-state memory device 100 in synchronism with the timing signal READ DQS DELAYED at the data transfer port 108. In this example, the host registers the incoming data signals READ DQ OUT from the data bus in a first-in-first-out ('FIFO') register and processes the data signals asynchronously. In another example, the host receives the delayed timing signal READ DQS DELAYED over a timing bus and samples the voltage that the solid-state memory device 100 has applied to the data bus in synchronism with a timing signal which is further delayed relative to the delayed timing signal READ DQS DELAYED, so that the host sampling occurs centered within the windows D0 to Dn for valid data latching and sampling.

Figure 5:
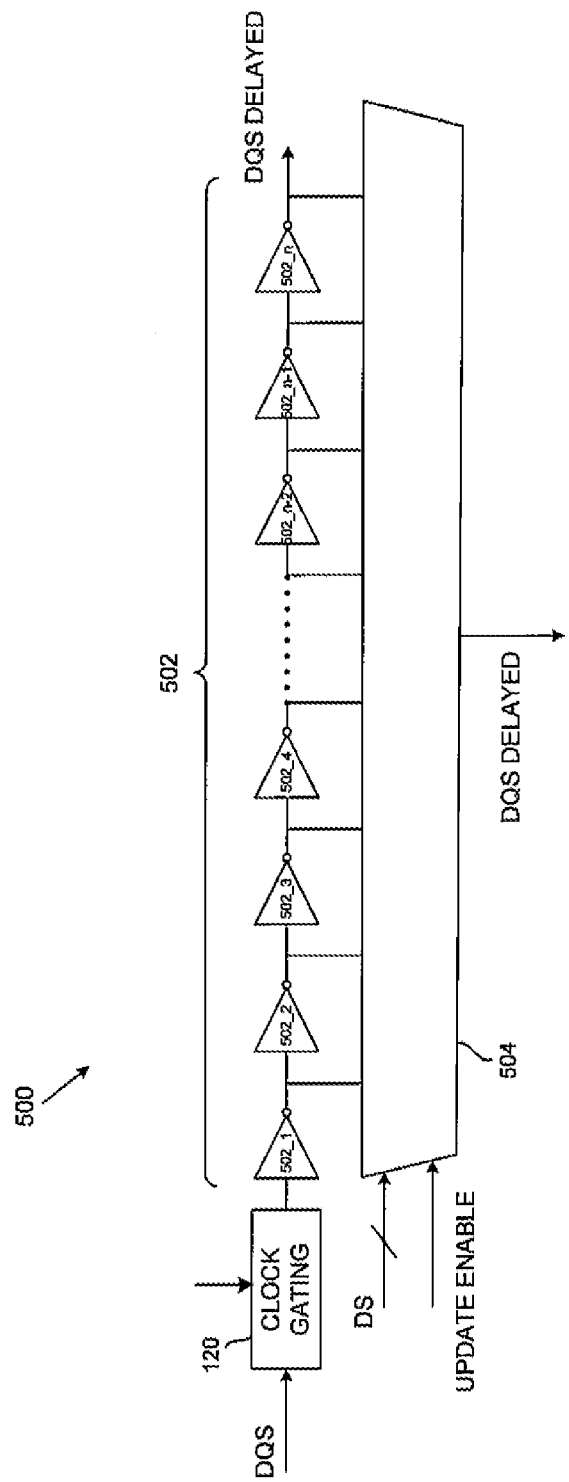
FIG. 5 is a schematic block diagram of an example of a delay line in the solid-state memory device of FIG. 1.

FIG. 5 shows an example 500 of the selectable delay module 112 having a delay line 502 whose delay is a function of a delay selection signal DS provided by the delay controller 114. The delay line 502 includes a plurality (n) of series connected delay elements 502_1 to 502_n that receives the signal DQS to be delayed and a multiplexer 504 for selecting a delayed signal DQS DELAYED from a number of the delay elements selected as a function of the delay selection signal DS. In effect, the multiplexer 504 selects the length of the delay line 502 and hence the delay introduced by the selectable delay module 112. Adjusting the selected delay during the pause includes the delay controller 114 adjusting the number of the delay elements 502_1 to 502_n selected by the multiplexer by adjusting the delay selection signal DS. The reference delay element and phase detector 116 in this example of the solid-state memory device 100 also includes a delay line and multiplexer having similar characteristics to the delay line 502 and multiplexer 504, but of fixed reference length, in a delay-locked loop (DLL).

In this example of the solid-state memory device 100, both for read and for write operations, the nominal delay of the delayed timing signal WRITE DQS DELAYED or READ DQS DELAYED relative to the timing signal WRITE DQS IN is a quarter cycle. At a transfer speed of 200 mega-transfers per second (MT/s), the window for valid data capture is less than 2 ns. During a long burst of data, variation in operating conditions such as voltage and temperature may cause the delay introduced by the selectable delay module 112 to vary more than 2 ns.

The delay controller 114 detects a variation in a delay produced by the selectable delay module 112 relative to a reference delay. The reference delay is provided by a reference clock signal REFERENCE CLOCK, which is generated by a stable clock generator (not shown), such as a phase-locked loop (PLL). The DLL in the reference delay element and phase detector 116 generates an internal signal whose frequency is set by the length of the delay line in the DLL and is nominally equal to (or an integer multiple of) the reference clock frequency. The delay of the fixed length delay line in the reference delay element and phase detector 116 varies with voltage and temperature in a similar way to the selectable delay module 112. Accordingly, when the phase of the internal signal in the reference delay element and phase detector 116 varies relative to the reference clock, this corresponds to a variation in the phase of the signal delayed by the delay line 502 in the selectable delay module 112.

If the phase difference detected corresponds to a phase variation of the signal delayed by the delay line 502 in the selectable delay module 112 greater than a threshold value corresponding to a maximum acceptable time window for latching the data signal DQ, the delay selection signal DS is adjusted to compensate for the variation. However, if the delay selection signal DS were adjusted while the timing signal DQS is running, there would be a likelihood of clock glitches. Waiting to adjust the delay selection signal DS until the end of a block of data transfer would incur a likelihood of data write or read errors. Accordingly, if the phase variation detected is greater than the threshold value corresponding to the maximum acceptable time window, the reference delay element and phase detector 116 asserts a signal UPDATE REQUEST which it applies to the burst finite state machine 118.

The finite state machine 118 then introduces a pause in transfer of the block of the data signals DQ in accordance with the ONFi specification, and the reference delay element and phase detector 116 adjusts the selected delay during the pause. In more detail, when the signal UPDATE REQUEST is asserted, the finite state machine 118 adopts the pause state, in which it de-asserts the address latch enable signal ALE and the command latch enable signal CLE to set the data bus to idle, blocks the clock gating element 120 to interrupt the timing signals DQS and enables adjustment of the delay selection signal DS and update of the number of delay line elements by the multiplexer 504. After a time tCAD specified by the ONFi specification, the finite state machine 118 adopts the burst state again, in which it asserts the address latch enable signal ALE and the command latch enable signal CLE again to free the data bus to resume transfer of the data block, and unblocks the clock gating element 120 to resume the timing signals DQS.

The invention may be at least partially implemented in a computer program for running on a computer system, including code portions for performing steps of a method according to the invention when run on a programmable apparatus, such as a process, system on a chip (SOC) or computer system, or enabling a programmable apparatus to perform functions of a device or system according to the invention. The invention also could be implemented as microcode or firmware. A computer program is a list of instructions such as a particular application program and/or an operating system. The computer program may for instance include one or more of: a subroutine, a function, a procedure, an object method, an object implementation, an executable application, an applet, a servlet, source code, object code, a shared library/dynamic load library and/or other sequence of instructions designed for execution on a computer system. The computer program may be stored internally on computer readable storage medium or transmitted to the computer system via a computer readable transmission medium. All or some of the computer program may be provided on computer readable media permanently, removably or remotely coupled to a computer system.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice-versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Similarly, any arrangement of components to achieve the same functionality is effectively "associated" such that the desired functionality is achieved. Hence, any two components combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality. Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

In the claims, the words 'comprising,' 'including,' or 'having' do not exclude the presence of other elements or steps then those listed in a claim. The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A solid-state memory device having a memory module and a memory interface, the memory interface comprising:
a timing signal port for receiving a timing signal;
a data transfer port;

a data transfer module for transferring blocks of data signals between said data transfer port and said memory module;

a selectable delay module for providing a selected delay between transitions in said data signals and transitions in said timing signals; and a delay controller for setting said selected delay, for detecting a variation in a delay produced by said selectable delay module relative to a reference delay, for controlling a pause in transfer of a block of said data signals, and for adjusting said selected delay during said pause.

2. The solid-state memory device of claim 1, wherein said selectable delay module provides a selected delay in said data signals when said data transfer module is transferring blocks of data signals into said memory module for write operations.

3. The solid-state memory device of claim 1, wherein said selectable delay module provides a selected delay in said timing signal when said data transfer module is transferring blocks of data signals from said memory module to said data transfer port for read operations.

4. The solid-state memory device of claim 1, wherein said data transfer module is a double data rate transfer module.

5. The solid-state memory device of claim 1, wherein said delay controller includes a reference delay element and phase detector for detecting said variation in a delay.

6. The solid-state memory device of claim 1, wherein said controlling a pause in transfer of a block of said data signals includes said delay controller pausing application of said timing signals to said data transfer module.

7. The solid-state memory device of claim 1, wherein said selectable delay module has a delay line whose delay is a function of said delay selection signal.

8. The solid-state memory device of claim 7, wherein said delay line includes a series connection of delay elements receiving the signal to be delayed and a multiplexer for selecting a delayed signal from a number of said delay elements selected as a function of said delay selection signal.

9. The solid-state memory device of claim 8, wherein said adjusting said selected delay during said pause includes said delay controller adjusting said number of said delay elements selected by said multiplexer by adjusting said delay selection signal.

10. A solid-state flash memory device having a flash memory module and a memory interface, the memory interface comprising:

a timing signal port for receiving a timing signal;

a data transfer port;

a data transfer module for transferring blocks of data signals between said data transfer port and said memory module;

a selectable delay module for providing a selected delay between transitions in said data signals and transitions in said timing signals; and a delay controller for setting said selected delay, for detecting a variation in a delay produced by said selectable delay module relative to a reference delay, for controlling a pause in transfer of a block of said data signals, and for adjusting said selected delay during said pause.

11. The solid-state memory device of claim 10, wherein said selectable delay module provides a selected delay in said data signals when said data transfer module is transferring blocks of data signals to said memory module for write operations.

12. The solid-state memory device of claim 10, wherein said selectable delay module provides a selected delay in said timing signal when said data transfer module is transferring blocks of data signals from said memory module to said data transfer port for read operations.

13. The solid-state memory device of claim 10, wherein said data transfer module is a double data rate transfer module.

14. The solid-state memory device of claim 10, wherein said delay controller includes a reference delay element and a phase detector for detecting said variation in a delay.

15. The solid-state memory device of claim 10, wherein said controlling a pause in transfer of a block of said data signals includes said delay controller pausing application of said timing signals to said data transfer module.

16. The solid-state memory device of claim 10, wherein said selectable delay module has a delay line whose delay is a function of said delay selection signal.

17. The solid-state memory device of claim 16, wherein said delay line includes a plurality of series connected delay elements receiving the signal to be delayed and a multiplexer for selecting a delayed signal from a said delay elements selected as a function of said delay selection signal.

18. The solid-state memory device of claim 17, wherein said adjusting said selected delay during said pause includes said delay controller adjusting said number of said delay elements selected by said multiplexer by adjusting said delay selection signal.

* * * * *